(12) United States Patent
  Carta et al.

(10) Patent No.: US 10,374,103 B1
(45) Date of Patent: Aug. 6, 2019

(54) CRYSTALLIZED SILICON VERTICAL DIODE ON BEOL FOR ACCESS DEVICE FOR CONFINED PCM ARRAYS

(71) Applicant: INTERNATIONAL BUSINESS MACHINES CORPORATION, Armonk, NY (US)

(72) Inventors: Fabio Carta, Pleasantville, NY (US); Chung H. Lam, Peekskill, NY (US); Matthew J. BrightSky, Pound Ridge, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/938,705

(22) Filed: Mar. 28, 2018

(51) Int. Cl.
  *H01L 21/338* (2006.01)
  *H01L 29/872* (2006.01)
  *H01L 21/02* (2006.01)
  *H01L 27/24* (2006.01)
  *H01L 21/20* (2006.01)

(52) U.S. Cl.
  CPC ...... *H01L 29/872* (2013.01); *H01L 21/02381* (2013.01); *H01L 21/02532* (2013.01); *H01L 21/02667* (2013.01); *H01L 21/2026* (2013.01); *H01L 27/2409* (2013.01)

(58) Field of Classification Search
  CPC . H01L 33/0012; H01L 27/2454; H01L 45/06; H01L 45/065
  See application file for complete search history.

(56) References Cited

U.S. PATENT DOCUMENTS

| | | | |
|---|---|---|---|
| 6,933,530 B2 | 8/2005 | Toet et al. | |
| 7,645,646 B2 | 1/2010 | Young | |
| 7,772,067 B2 * | 8/2010 | Lee | H01L 27/2409 257/E45.002 |
| 8,405,062 B2 | 3/2013 | Yin et al. | |
| 8,809,168 B2 | 8/2014 | Bedell et al. | |
| 8,817,533 B2 | 8/2014 | Gopalakrishnan | |
| 8,830,725 B2 | 9/2014 | Bethune et al. | |
| 2012/0210932 A1 | 8/2012 | Hekmatshoar-Tabari et al. | |

FOREIGN PATENT DOCUMENTS

CN   101789473 A   7/2010

* cited by examiner

*Primary Examiner* — Hsien Ming Lee
(74) *Attorney, Agent, or Firm* — Tutunjian & Bitetto, P.C.; L. Jeffrey Kelly

(57) ABSTRACT

A method is presented for integrating an electronic component in back end of the line (BEOL) processing. The method includes forming a first electrode over a semiconductor substrate, forming a first electrically conductive material over a portion of the first electrode, and forming a second electrically conductive material over the first electrically conductive material, where the first and second electrically conductive materials define a p-n junction. The method further includes depositing a second electrode between a set of spacers and in direct contact with the p-n-junction, depositing a phase change material over the p-n junction and in direct contact with the second electrode, and forming a third electrode over a portion of the phase change material.

20 Claims, 4 Drawing Sheets

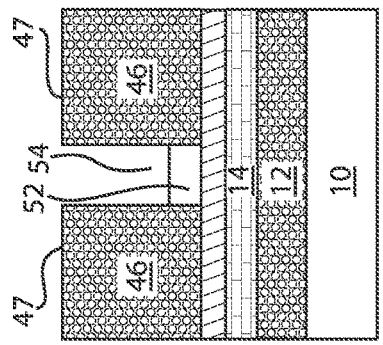
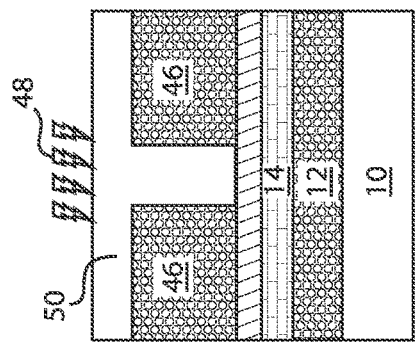
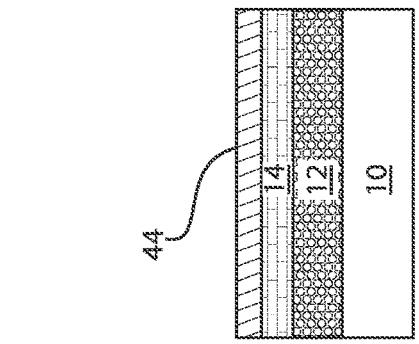
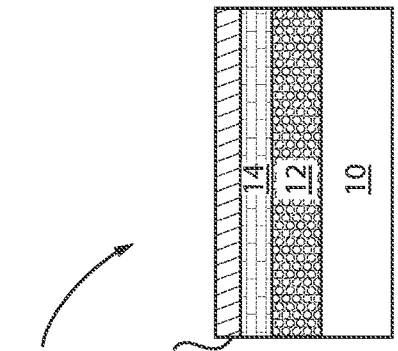
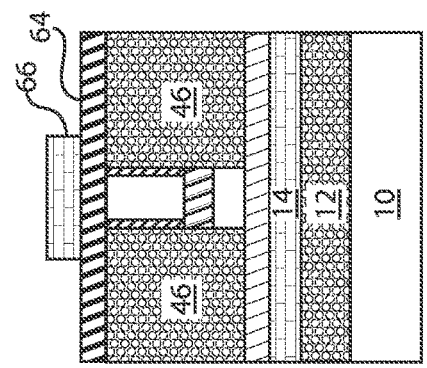
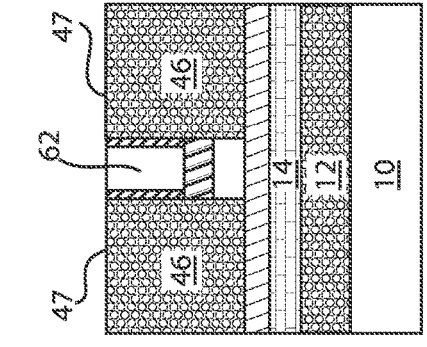
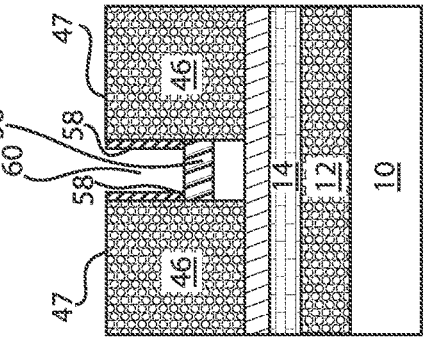
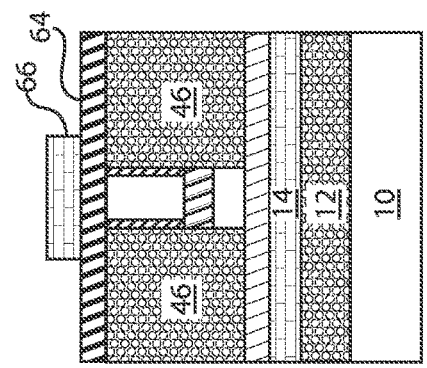

CRYSTALLIZED SILICON VERTICAL DIODE ON BEOL FOR ACCESS DEVICE FOR CONFINED PCM ARRAYS

BACKGROUND

Technical Field

The present invention relates generally to semiconductor devices, and more specifically, to forming a crystallized silicon vertical diode on back end of the line (BEOL) processing for an access device combined with a phase change material (PCM) memory.

Description of the Related Art

In order to increase density of memory technologies (both volatile and nonvolatile), a crosspoint design can be employed. In such an optimized design, wordlines and bitlines run at a minimum pitch=2F, where F refers to a lithographic minimum feature size, and storage elements are placed between these perpendicularly oriented memory lines at their crosspoints. Two designs are conventionally employed in such memory technologies. One is a nano-crossbar design, which refers to a design where memory lines run at sub-lithographic pitches. The other design is a 3D design, which refers to a design where memory lines run at lithographic pitches, with multiple layers of memories being provided. In either design case, two device components are needed at the intersection of the memory lines. That is, a memory element, which refers to an element that is used to store data/information and a rectifying element or access device.

SUMMARY

In accordance with an embodiment, a method is provided for integrating an electronic component in back end of the line (BEOL) processing. The method includes forming a first electrode over a semiconductor substrate, forming a first electrically conductive material over a portion of the first electrode, forming a second electrically conductive material over the first electrically conductive material, where the first and second electrically conductive materials define a p-n junction, depositing a second electrode between a set of spacers and in direct contact with the p-n-junction, depositing a phase change material over the p-n junction and in direct contact with the second electrode, and forming a third electrode over a portion of the phase change material.

In accordance with another embodiment, a method is provided for integrating an electronic component in back end of the line (BEOL) processing. The method includes forming a first electrode over a semiconductor substrate, forming a first electrically conductive material over the first electrode, forming an undoped intrinsic semiconductor layer over the first electrically conductive material, and forming a second electrically conductive material over the undoped intrinsic semiconductor layer, where the first electrically conductive material, the undoped intrinsic semiconductor layer, and the second electrically conductive material define a p-i-n junction. The method further includes depositing a second electrode between a set of spacers and in direct contact with the p-i-n-junction, depositing a phase change material over the p-i-n junction and in direct contact with the second electrode, and forming a third electrode over a portion of the phase change material.

In accordance with yet another embodiment, a semiconductor structure is presented for integrating an electronic component in back end of the line (BEOL) processing. The semiconductor structure includes a first electrode formed over a semiconductor substrate, a first electrically conductive material formed over a portion of the first electrode, a second electrically conductive material formed over the first electrically conductive material, where the first and second electrically conductive materials define a p-n junction, a second electrode deposited between a set of spacers and in direct contact with the p-n-junction, a phase change material deposited over the p-n junction and in direct contact with the second electrode, and a third electrode formed over a portion of the phase change material.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 9 is a cross-sectional view of the semiconductor structure having an amorphous silicon (a-Si) doped layer deposited over a first metal line, in accordance with another embodiment of the present invention;

FIG. 10 is a cross-sectional view of the semiconductor structure of FIG. 9 where the doped a-Si is converted to polysilicon (poly-Si) by an excimer laser, in accordance with an embodiment of the present invention;

FIG. 11 is a cross-sectional view of the semiconductor structure of FIG. 10 where a Si layer is deposited and exposure to an excimer laser takes place, in accordance with an embodiment of the present invention;

FIG. 12 is a cross-sectional view of the semiconductor structure of FIG. 11 where the Si is etched to form a recess, in accordance with an embodiment of the present invention;

FIG. 13 is a cross-sectional view of the semiconductor structure of FIG. 12 where doped poly-Si is deposited, in accordance with an embodiment of the present invention;

FIG. 14 is a cross-sectional view of the semiconductor structure of FIG. 13 where spacers are formed within the recess and over the doped poly-Si, in accordance with an embodiment of the present invention;

FIG. 15 is a cross-sectional view of the semiconductor structure of FIG. 14 where an electrode is deposited between the spacers, in accordance with an embodiment of the present invention;

FIG. 16 is a cross-sectional view of the semiconductor structure of FIG. 15 where a phase change material (PCM) is deposited over the structure and a second metal line is deposited crosswise with respect to the first metal line, in accordance with an embodiment of the present invention;

Throughout the drawings, same or similar reference numerals represent the same or similar elements.

DETAILED DESCRIPTION

Figure 1:
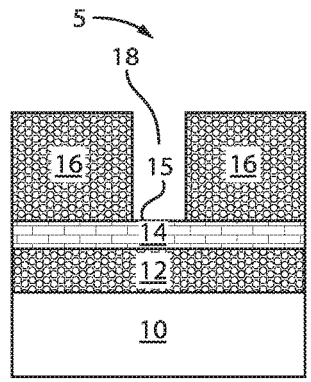
FIG. 1 is a cross-sectional view of a semiconductor structure having an opening formed through the interlayer dielectric (ILD) to expose a top surface of a first metal line, in accordance with an embodiment of the present invention.

Embodiments in accordance with the present invention provide methods and devices for creating a memory architecture incorporated or integrated with a cross-point array architecture. A cross-point array architecture has the potential for achieving a fast, random access, nonvolatile memory with the highest density and smallest cell size possible. Nonvolatile resistance memory elements that can be placed at a cross-point of word-lines and bit-lines helps realize this potential. If this memory element is no larger than the pitch of these lines (2F), the cell is 2F×2F (4F$^2$) in area.

Embodiments in accordance with the present invention provide methods and devices for creating a memory architecture by employing a poly-silicon (poly-Si) diode compatible with back end of the line (BEOL) processing. The poly-Si diode can be incorporated or integrated in the cross-point array architecture. The poly-Si diode can be a vertically integrated p-n junction with confined phase change memory. Alternatively, the poly-Si diode can be a vertically integrated p-i-n junction with confined phase change memory. Thus, various structures of diodes with vertically integrated memory elements are introduced for BEOL processing.

Embodiments in accordance with the present invention provide methods and devices for employing phase change based materials in nonvolatile random access memory cells. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state. It is desirable to minimize the magnitude of the reset current used to cause transition of the phase change material from a crystalline state to an amorphous state. The magnitude of the needed reset current can be reduced by reducing the volume of the active region in the phase change material element in the cell.

Examples of semiconductor materials that can be employed in forming such structures include silicon (Si), germanium (Ge), silicon germanium alloys (SiGe), silicon carbide (SiC), silicon germanium carbide (SiGeC), compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity.

This is not intended to be interpreted as a limitation of any particular embodiment, or illustration, or scope of the claims.

FIG. 1 is a cross-sectional view of a semiconductor structure having an opening formed through the interlayer dielectric (ILD) to expose a top surface of a first metal line, in accordance with an embodiment of the present invention.

In various exemplary embodiments, a semiconductor structure 5 includes an interlayer dielectric (ILD) 12 deposited over a substrate 10. A first metal layer or first metal line 14 is formed over the HD 12. A second ILD layer 16 is formed over the metal line 14. An opening or recess 18 is formed through the ILD 16 to expose a top surface 15 of the first metal line 14.

The semiconductor substrate 10 that is employed in the present application can include any semiconductor material. Illustrative examples of semiconductor materials that can be employed for the semiconductor substrate 10 include, but are not limited to, Si, SiGe alloys, SiGeC, SiC, Ge alloy, GaSb, GaP, GaN, GaAs, InAs, INP, AlN and all other III-V or II-VI compound semiconductors. In one embodiment, the semiconductor substrate 10 can include a multilayered stack of such semiconductor materials. In some embodiments, the semiconductor substrate 10 can include a bulk semiconductor substrate. By "bulk" it is meant the entirety of the semiconductor substrate 10 from one surface to an opposite surface is composed of a semiconductor material. In other embodiments, the semiconductor substrate 10 can include a semiconductor-on-insulator (SOI) substrate.

In various embodiments, the height of the ILD oxide 16 can be reduced by chemical-mechanical polishing (CMP) and/or etching. Therefore, the planarization process can be provided by CMP. Other planarization process can include grinding and polishing.

In one or more embodiments, the ILDs 12, 16 can have a thickness in the range of about 10 nm to about 100 nm, or in the range of about 10 nm to about 50 nm.

The ILDs 12, 16 can be selected from the group consisting of silicon containing materials such as $SiO_2$, $Si_3N_4$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H. Additional choices for the ILDs 12, 16 include any of the aforementioned materials in porous form, or in a form that changes during processing to or from being porous and/or permeable to being non-porous and/or non-permeable.

Figure 2:
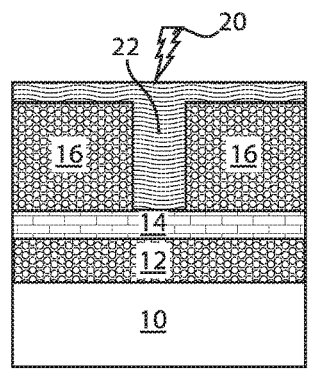
FIG. 2 is a cross-sectional view of the semiconductor structure of FIG. 1 where doped silicon (Si) is deposited and converted to polysilicon (poly-Si) by an excimer laser, in accordance with an embodiment of the present invention.

FIG. 2 is a cross-sectional view of the semiconductor structure of FIG. 1 where doped silicon (Si) is deposited and converted to polysilicon (poly-Si) by an excimer laser, in accordance with an embodiment of the present invention.

Amorphous silicon (a-Si) 22 is deposited within the opening 18 and over the ILD portions 16. Radiation is applied to the a-Si 22 via an excimer laser 20. The a-Si 22 can be doped before application of the excimer laser 20. The excimer laser 20 converts the a-Si to, e.g., polysilicon (poly-Si) layer 22. Poly-Si layer 22 can be, e.g., a doped poly-Si layer 22.

A laser is an electronic-optical device that emits coherent radiation. In some embodiments, a laser emits light in a narrow, low-divergence beam and with a defined wavelength (corresponding to a particular color if the laser operates in the visible spectrum). In some embodiments, the laser type that is employed in the laser annealing method is an excimer laser 20. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include $F_2$ (fluorine, emitting at 157 nm), and noble gas compounds (ArF (193 nm), KrCl (222 nm), KrF (248 nm), XeCl (308 nm), and XeF (351 nm)).

The excimer laser 20 can be generated from at least one of the excimers selected from the group consisting of $Ar_2$, $Kr_2$, $F_2$, $Xe_2$, ArF, KrF, XeBr, XeCl, XeCl, XeF, $CaF_2$, KrCl, and $Cl_2$ wherein the wavelength of the excimer laser is in the range from about 50 to about 300 nm.

Figure 3:
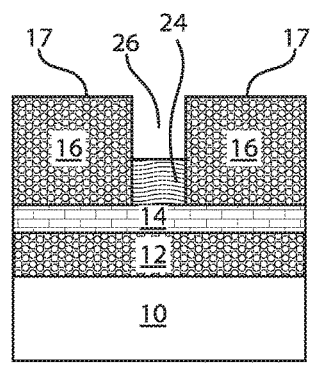
FIG. 3 is a cross-sectional view of the semiconductor structure of FIG. 2 where the polysilicon is etched, in accordance with an embodiment of the present invention.

FIG. 3 is a cross-sectional view of the semiconductor structure of FIG. 2 where the polysilicon is etched, in accordance with an embodiment of the present invention.

In various exemplary embodiments, the poly-Si 22 is etched such that a poly-Si portion or section 24 remains between the ILDs 16. A top surface 17 of the ILDs 16 is also exposed. Moreover, an opening or recess 26 is formed over the poly-Si layer 24 and in between the ILDs 16. The layer 24 can be a p-doped or an n-doped Si layer.

Figure 4:
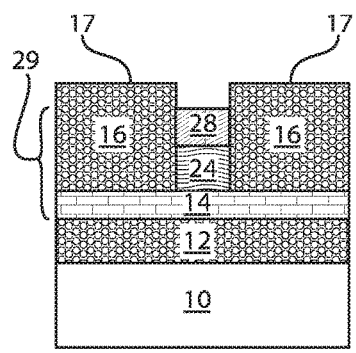
FIG. 4 is a cross-sectional view of the semiconductor structure of FIG. 3 where a doped poly-Si layer is deposited, in accordance with an embodiment of the present invention.

FIG. 4 is a cross-sectional view of the semiconductor structure of FIG. 3 where a doped poly-Si layer is deposited, in accordance with an embodiment of the present invention.

In various exemplary embodiments, a doped poly-Si layer 28 is deposited or formed over the doped poly-Si section 24. In an alternative embodiment, Si can be implanted and then activated. The layer 28 can be a p-doped or an n-doped layer. In one embodiment, layers 24, 28 are oppositely doped. Layers 24, 28 can be referred to as electrically conductive material layers.

The poly-Si layer 24 and the poly-Si layer 28 together form a p-n junction 29. The p-n junction 29 is a boundary or interface between two types of semiconductor materials, p-type and n-type, inside a single crystal of semiconductor. The "p" (positive) side includes an excess of holes, while the "n" (negative) side includes an excess of electrons in the outer shells of the electrically neutral atoms there. This allows electrical current to pass through the junction only in one direction. The p-n junction 29 can be created by doping, for example by ion implantation or diffusion of dopants. The p-n junction 29 can also be referred to as a p-n junction diode. The diode conducts current in only one direction, and it is made by joining a p-type semiconducting layer (e.g., layer 24) to an n-type semiconducting layer (e.g., layer 28).

Figure 5:
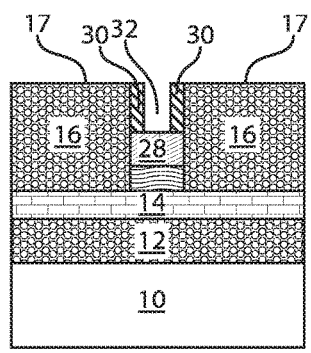
FIG. 5 is a cross-sectional view of the semiconductor structure of FIG. 4 where spacers are formed within the opening and over the doped poly-Si layer, in accordance with an embodiment of the present invention.

FIG. 5 is a cross-sectional view of the semiconductor structure of FIG. 4 where spacers are formed within the opening and over the doped poly-Si layer, in accordance with an embodiment of the present invention.

In various exemplary embodiments, spacers 30 can be formed adjacent the ILDs 16 and over the doped poly-Si layer 28 or over the p-n junction 29. The formation of the spacers 30 results in gap 32 between the spacers 30.

Spacers 30 can be, e.g., a nitride film (i.e., nitride layer). In an embodiment, the spacers 30 can be an oxide, for example, silicon oxide (SiO), a nitride, for example, a silicon nitride (SiN), or an oxynitride, for example, silicon oxynitride (SiON). In an embodiment, the spacers 30 can be, e.g., silicon oxycarbonitride (SiOCN), SiBCN, or similar film types. In some exemplary embodiments, the spacers 30 can include a material that is resistant to some etching processes such as, for example, hydrogen fluoride (HF) chemical etching or chemical oxide removal etching.

Figure 6:
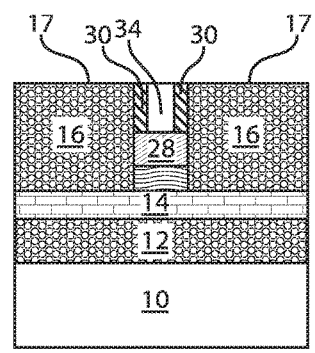
FIG. 6 is a cross-sectional view of the semiconductor structure of FIG. 5 where an electrode is deposited between the spacers, in accordance with an embodiment of the present invention.

FIG. 6 is a cross-sectional view of the semiconductor structure of FIG. 5 where an electrode is deposited between the spacers, in accordance with an embodiment of the present invention.

In various exemplary embodiments, the electrode 34 contacts an upper surface of the p-n junction 29. The height of the electrode 34 can be reduced by chemical-mechanical polishing (CMP) and/or etching. Therefore, the planarization process can be provided by CMP. Other planarization process can include grinding and polishing.

The electrode 34 can be, e.g., formed from Ta, Ti/TiN, W, WN, TaN, polysilicon, doped polysilicon, amorphous silicon, doped amorphous silicon, or any other suitable material, or any other conductive material. Alternatively, the electrode 34 can be, e.g., any suitable conductive material or materials, e.g., Ag, Al, Cu, Ta, TaN, Ti, TiN, Al, W or any other suitable material, and may be deposited or formed in any suitable manner.

Figure 7:
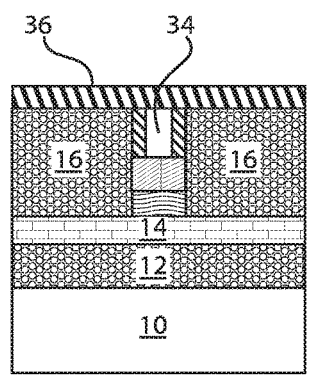
FIG. 7 is a cross-sectional view of the semiconductor structure of FIG. 6 where a phase change material (PCM) is deposited over the structure, in accordance with an embodiment of the present invention.

FIG. 7 is a cross-sectional view of the semiconductor structure of FIG. 6 where a phase change material (PCM) is deposited over the structure, in accordance with an embodiment of the present invention.

In various exemplary embodiments, a phase change material 36 is deposited over the structure. The phase change material 36 contacts an upper surface of the ILDs 16, an upper surface of the spacers 30, and an upper surface of the electrode 34. The phase change material 36 extends a length of the ILD 12 and extends a length of the first metal line 14.

Phase change material 36 can be changed from one phase state to another by application of electrical pulses. A shorter, higher amplitude pulse tends to change the phase change material 36 to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to melt the material in the active volume, and short enough to allow the material to solidify in the amorphous state.

The phase change material 36 can include chalcogenide based materials and other materials. Chalcogens include any of the four elements oxygen (O), sulfur (S), selenium (Se), and tellurium (Te), forming part of group VI of the periodic table. Chalcogenides include compounds of a chalcogen with a more electropositive element or radical. Chalcogenide alloys include combinations of chalcogenides with other materials such as transition metals. A chalcogenide alloy usually includes one or more elements from column six of the periodic table of elements, such as germanium (Ge) and tin (Sn). Often, chalcogenide alloys include combinations including one or more of antimony (Sb), gallium (Ga), indium (In), and silver (Ag). Phase change based memory materials can include alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable.

Chalcogenides and other phase change materials are doped with impurities in some embodiments to modify conductivity, transition temperature, melting temperature, and other properties of memory elements using the doped chalcogenides. Representative impurities employed for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide.

Figure 8:
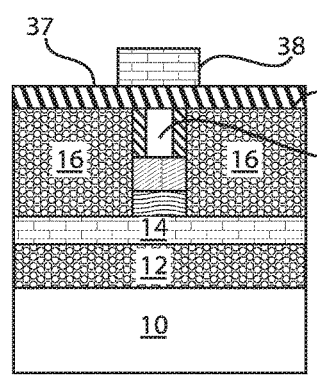
FIG. 8 is a cross-sectional view of the semiconductor structure of FIG. 7 where a second metal line is deposited crosswise with respect to the first metal line, in accordance with an embodiment of the present invention.

FIG. 8 is a cross-sectional view of the semiconductor structure of FIG. 7 where a second metal line is deposited crosswise with respect to the first metal line, in accordance with an embodiment of the present invention.

In various exemplary embodiments, a second metal layer or metal line or top electrode 38 is deposited on a top surface 37 of the phase change material 36. Thus, a p-n junction 29 with a phase change material 36 are sandwiched between the bottom electrode 14 and the top electrode 38 of a cross-point array. The p-n junction 29 can be referred to as the access device and the phase change material 36 can be referred to as the memory element. The p-n junction 29 is fabricated in series with the PCM 36 to be compatible with a BEOL wafer stack.

The first metal line or bottom electrode 14 can be, e.g., a boron-doped or other p-type polysilicon electrode that is in contact with a lower end face of the doped poly-Si switching medium. The second metal line or top electrode 38 can be, e.g., a conductive layer containing silver (Ag). Although silver can be employed, it will be understood that the top electrode 14 can be formed from various other suitable metals, such as gold (Au), nickel (Ni), aluminum (Al), chromium (Cr), iron (Fe), manganese (Mn), tungsten (W), vanadium (V), and cobalt (Co). It is preferred that all or part of the portions of bottom electrode 14 contacting the access device include an electrode material, such as TiN, or another conductor selected for compatibility with the phase change material. Other types of conductors can be employed for the top and bottom electrodes 38, 14, including for example aluminum and aluminum alloys, TiN, TaN, TiAlN or TaAlN. Other conductors that can be employed include one or more elements selected from the group consisting of Ti, W, Mo, Al, Ta, Cu, Pt, Ir, La, Ni, Ru and O.

FIG. 9 is a cross-sectional view of the semiconductor structure having an amorphous silicon (a-Si) doped layer deposited over a first metal line, in accordance with another embodiment of the present invention.

In an alternative embodiment, a semiconductor structure 40 includes an interlayer dielectric (ILD) 12 deposited over a substrate 10. A first metal layer or metal line 14 is formed over the ILD 12. A doped amorphous silicon (a-Si) layer 42 is then deposited or formed over the metal line 14.

FIG. 10 is a cross-sectional view of the semiconductor structure of FIG. 9 where the doped a-Si is converted to polysilicon (poly-Si) by an excimer laser, in accordance with an embodiment of the present invention.

In various exemplary embodiments, the doped a-Si layer 42 is converted to a poly-Si doped layer 44. An excimer laser, as described above, can be employed to convert the doped a-Si layer 42 to the poly-Si doped layer 44.

FIG. 11 is a cross-sectional view of the semiconductor structure of FIG. 10 where a Si layer is deposited and exposure to an excimer laser takes place, in accordance with an embodiment of the present invention.

In various exemplary embodiments, an ILD 46 is formed over the poly-Si doped layer 44. An opening is formed within the ILD 46 and filled with silicon (Si) material 50. The Si material 50 is exposed to radiation 48 from an excimer laser. The Si material 50 can be an undoped intrinsic semiconductor layer or region.

FIG. 12 is a cross-sectional view of the semiconductor structure of FIG. 11 where the Si is etched to form a recess, in accordance with an embodiment of the present invention.

In various exemplary embodiments, the Si material 50 is etched such that a Si material section 52 remains between the ILDs 46. Also, a top surface 47 of the ILDs 46 is exposed. The etching of the Si material 50 also results in opening or recess 54 formed between the ILDs 46. Section 52 can be referred to as the undoped intrinsic semiconductor layer or region.

FIG. 13 is a cross-sectional view of the semiconductor structure of FIG. 12 where doped poly-Si is deposited, in accordance with an embodiment of the present invention.

In various exemplary embodiments, doped poly-Si 56 is deposited over the Si material section 52. This forms a p-i-n junction 59 over the bottom electrode 14. The p-i-n junction 59 includes three differently doped regions. Namely, there is an intrinsic or undoped layer 52 sandwiched between a p-doped region (e.g., layer 44) and an n-doped region (e.g., layer 56). The p-i-n junction 59 can be fabricated from, e.g., amorphous silicon with a band gap of about 1.8 eV. The p-i-n junction 59 can be referred to as a p-i-n junction diode. A p-i-n diode is a diode with a wide, undoped intrinsic semiconductor region between a p-type semiconductor and an n-type semiconductor region. Therefore, a crystallized silicon vertical diode can be constructed in combination with a phase change material (FIG. 16) for BEOL processing.

FIG. 14 is a cross-sectional view of the semiconductor structure of FIG. 13 where spacers are formed within the recess and over the doped poly-Si, in accordance with an embodiment of the present invention.

In various exemplary embodiments, spacers 58 are formed within the recess 54 and over the doped poly-Si 56 or over the p-i-n junction 59. The formation of the spacers 58 results in gap 60 between the spacers 58.

FIG. 15 is a cross-sectional view of the semiconductor structure of FIG. 14 where an electrode is deposited between the spacers, in accordance with an embodiment of the present invention.

In various exemplary embodiments, the electrode 62 contacts an upper surface of the p-i-n junction 59. The height of the electrode 62 can be reduced by chemical-mechanical polishing (CMP) and/or etching. Therefore, the planarization process can be provided by CMP. Other planarization process can include grinding and polishing.

The electrode 62 can be, e.g., formed from Ta, Ti/TiN, W, WN, TaN, polysilicon, doped polysilicon, amorphous silicon, doped amorphous silicon, or any other suitable material, or any other conductive material. Alternatively, the electrode 62 can be, e.g., any suitable conductive material or materials, e.g., Ag, Al, Cu, Ta, TaN, Ti, TiN, Al, W or any other suitable material, and may be deposited or formed in any suitable manner.

FIG. 16 is a cross-sectional view of the semiconductor structure of FIG. 15 where a phase change material (PCM) is deposited and a second metal line is deposited crosswise with respect to the first metal line, in accordance with an embodiment of the present invention.

In various exemplary embodiments, a phase change material 64 is deposited over the structure. The phase change material 64 contacts an upper surface of the ILDs 16, an upper surface of the spacers 30, and an upper surface of the electrode 62.

In various exemplary embodiments, a second metal layer or metal line 66 is deposited over the phase change material 64, as well as over the spacers 58 and over a portion of the ILDs 46. The second metal layer 66 can be referred to as the top electrode. The p-i-n junction 59 is fabricated in series with the PCM 64 to be compatible with a BEOL wafer stack.

Therefore, the methods and structures describe herein (FIGS. 1-16) enable a silicon p-n diode or a silicon p-i-n diode constructed from low temperature deposited materials that are annealed with laser exposure. This results in fabrication of large polycrystalline materials. During this laser exposure, silicon layers reach a partial to complete melt, thus ensuring a large polycrystalline material is for ed. Another advantage of employing an excimer laser is that heat remains confined in the silicon layers and does not spread through the device. The excimer laser also enables crystallization of silicon on a BEOL wafer. Stated differently, methods and structures are provided for fabricating a cross-point array of p-n and p-i-n or Schottky silicon diodes in series with PCM memories with processes compatible with BEOL wafer stack and scalable to small pitches.

Figure 17:
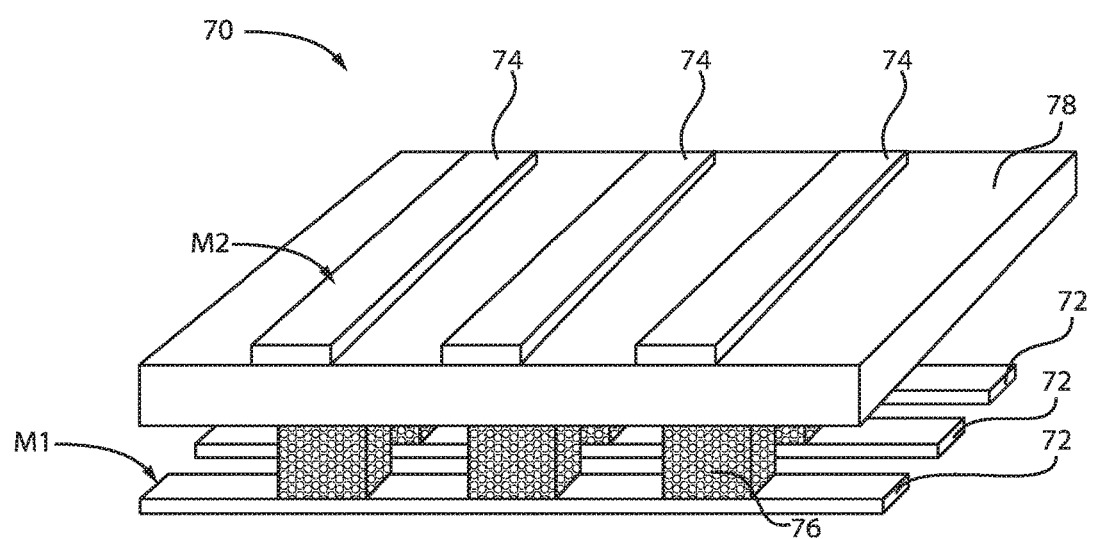
FIG. 17 is a perspective view of a crossbar array with access devices and memory elements formed between the metal lines, in accordance with an embodiment of the present invention.

FIG. 17 is a perspective view of a crossbar array with access devices and memory elements formed between the metal lines (top and bottom electrodes accordance with an embodiment of the present invention.

In various example embodiments, the semiconductor structure 76, 78 represents a memory cell incorporated between a plurality of bit lines 72 and a plurality of word lines 74. Thus, the array 70 is obtained by perpendicular conductive wordlines (rows) 74 and bitlines (columns) 72, where a cell structure 76, 78 with a memory element exists at the intersection between each row and column. The cell structure 76, 78 with the memory element can be accessed for read and write by biasing the corresponding wordline 74 and bitline 72. The cell structure includes an access device 76 and a memory element 78 (or mushroom memory element). The access device can be the p-n junction 29 or p-i-n junction 59 described above or a Schottky diode. The mushroom memory element can be the phase change materials 36, 64 described above and can be a single unit or single continuous component that extends over each of the individual access devices 29, 59.

In order to construct a large scale crossbar array, each cross point needs to have a high resistance (or low leakage current). Otherwise, a voltage drop across the metal lines becomes an issue. Resistive random access memory devices (ReRAM) devices usually have low switching resistance (~kOhm) due to a filamentary nature. This demands line resistance reduction beyond the conventional back end of line (BEOL) to enable large crossbar array structures. The exemplary embodiments of the present invention alleviate this issue by lodging or wedging an access device having a phase change material at the intersection of the wordlines and bitlines (or op and bottom electrodes). Moreover, emerging memories can be fabricated in the BEOL at relatively low temperatures, which allows for easy integration with CMOS devices and stacking in 3D. For all these reasons, vertical diodes integrated with PCM are promising not only for nonvolatile memories, but also for computing memories, thus allowing for fast data access and for computing architectures blurring a distinction between memory and computing circuits, such as nonvolatile memristive logic computation or neuromorphic networks.

Figure 18:
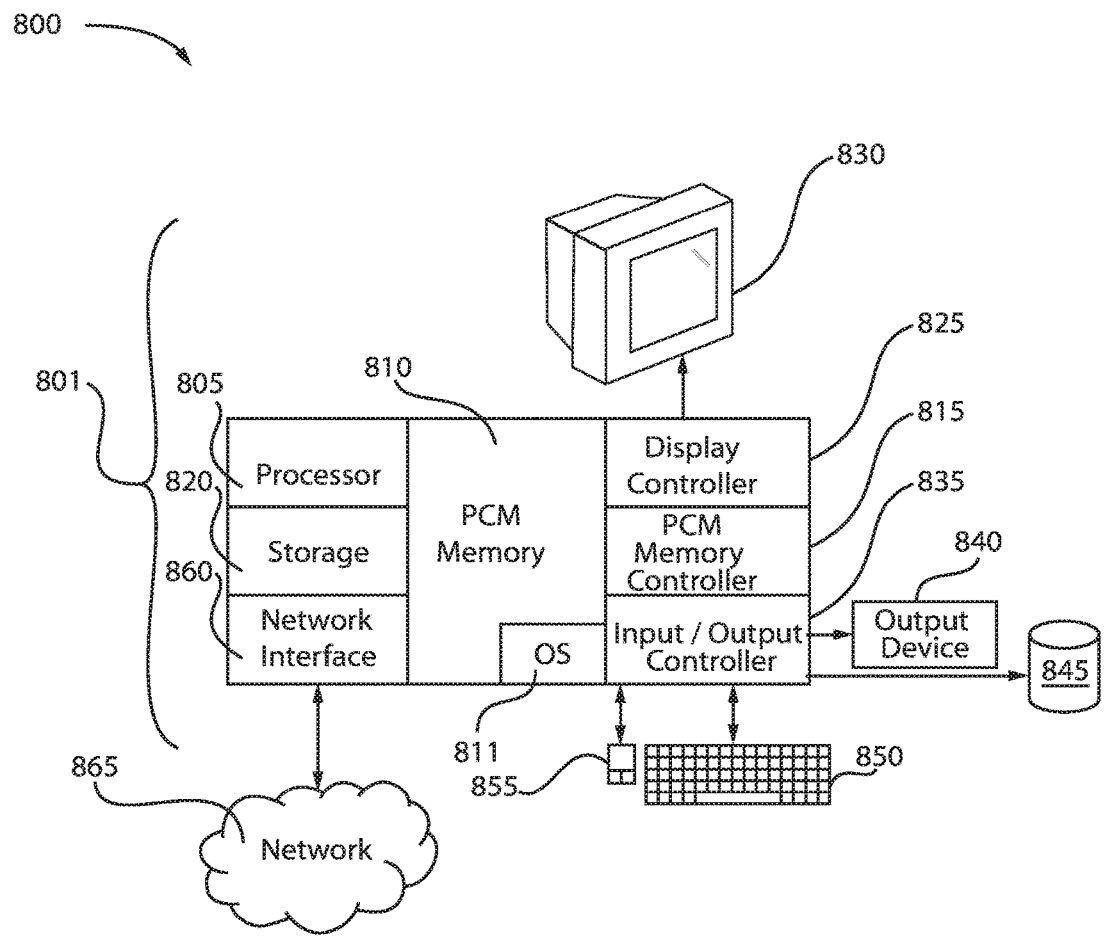
FIG. 18 is a schematic block diagram of an embodiment of a computing system adapted for performing the method for employing a vertical diode with a phase change memory array, in accordance with an embodiment of the present invention.

FIG. 18 is a schematic block diagram of an embodiment of a computing system adapted for performing the method for employing a vertical diode with a phase change memory array, in accordance with an embodiment of the present invention.

The system 800 schematically represents a computerized unit 801, e.g., a general-purpose computer. In exemplary embodiments, in terms of hardware architecture, the unit 801 includes a processor 805, memory 810 coupled to a PCM memory controller 815, and one or more input and/or output (PO) devices 840, 845, 850, 855 (or peripherals) that are communicatively coupled via a local input/output controller 835. The input/output controller 835 can be, but is not limited to, one or more buses or other wired or wireless connections. The input/output controller 835 can have additional elements, which are omitted for simplicity, such as controllers, buffers (caches), drivers, repeaters, and receivers, to enable communications. Further, the local interface can include address, control, and/or data connections to enable appropriate communications among the components.

The processor 805 is a hardware device for executing software, particularly that stored in PCM memory 810. The processor 805 can be any custom made or commercially available processor, a central processing unit (CPU), an auxiliary processor among several processors associated with the computer 801, a semiconductor based microprocessor (in the form of a microchip or chip set), or generally any device for executing software instructions.

The PCM memory 810 can include any one or combination of volatile memory elements (e.g., random access memory) and nonvolatile memory elements. The PCM memory 810 can incorporate electronic, magnetic, optical, and/or other types of storage media. Note that the PCM memory 810 can have a distributed architecture, where various components are situated remote from one another, but can be accessed by the processor 805.

The software in memory 810 can include one or more separate programs, each of which includes an ordered listing of executable instructions for implementing logical functions. The software in the memory 810 includes methods described herein in accordance with exemplary embodiments and a suitable operating system (OS) 811. The OS 811 essentially controls the execution of other computer programs, and provides scheduling, input-output control, file and data management, memory management, and communication control and related services.

The methods described can be in the form of a source program, executable program (object code), script, or any other entity including a set of instructions to be performed. When in a source program form, then the program needs to be translated via a compiler, assembler, interpreter, or the like, as known per se, which can or cannot be included within the memory 810, so as to operate properly in connection with the OS 811. The methods can be written as an object oriented programming language, which has classes of data and methods, or a procedure programming language, which has routines, subroutines, and/or functions.

A conventional keyboard 850 and mouse 855 can be coupled to the input/output controller 835. Other I/O devices 840-855 can include sensors (especially in the case of network elements), e.g., hardware devices that produce a measurable response to a change in a physical condition like temperature or pressure (physical data to be monitored). The analog signal produced by the sensors is digitized by an analog-to-digital converter and sent to controllers 835 for further processing. Sensor nodes are ideally small, consume low energy, are autonomous and operate unattended.

The I/O devices 840-855 can further include devices that communicate both inputs and outputs. The system 800 can further include a display controller 825 coupled to a display 830. In the exemplary embodiments, system 800 can further include a network interface or transceiver 860 for coupling to a network 865.

The network 865 transmits and receives data between the unit 801 and external systems. The network 865 can be implemented in a wireless fashion, e.g., using wireless protocols and technologies, such as IEEE 802.15.4 or similar. The network 865 can be a fixed wireless network, a wireless local area network (LAN), a wireless wide area network (WAN) a personal area network (PAN), a virtual private network (VPN), intranet or other suitable network system and includes equipment for receiving and transmitting signals.

When the unit 801 is in operation, the processor 805 can be configured to execute software stored within the PCM memory 810, to communicate data to and from the PCM memory 810, and to generally control operations of the computer 801 pursuant to the software. The methods described herein and the OS 811, in whole or in part are read by the processor 805, usually buffered within the processor 805, and then executed. When the methods described herein are implemented in software, the methods can be stored on any computer readable medium, such as storage 820, for use by or in connection with any computer related system or method.

Regarding FIGS. 1-15, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an elements referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for integrating an electronic component in back end of the line (BEOL) processing (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for integrating an electronic component in back end of the line (BEOL) processing, the method comprising:
    forming a first electrode over a semiconductor substrate;
    forming a first electrically conductive material over a portion of the first electrode;
    forming a second electrically conductive material over the first electrically conductive material, where the first and second electrically conductive materials define a p-n junction;
    depositing a second electrode between a set of spacers and in direct contact with the p-n-junction;
    depositing a phase change material over the p-n junction and in direct contact with the second electrode; and
    forming a third electrode over a portion of the phase change material.

2. The method of claim 1, wherein the first electrically conductive material is an n-type poly-silicon layer.

3. The method of claim 2, wherein second electrically conductive material is a p-type poly-silicon layer.

4. The method of claim 1, further comprising forming the p-n junction and the second electrode between interlayer dielectric (ILD) regions.

5. The method of claim 1, wherein the phase change material extends a length of the first electrode.

6. The method of claim 1, wherein the electronic component is a poly-silicon diode.

7. The method of claim 1, wherein the p-n junction is an access device and the phase change material is a memory element, the access device combined with the memory element to be positioned between a plurality of first and third electrodes defining a crosspoint array.

8. A method for integrating an electronic component in back end of the line (BEOL) processing, the method comprising:
   forming a first electrode over a semiconductor substrate;
   forming a first electrically conductive material over the first electrode;
   forming an undoped intrinsic semiconductor layer over the first electrically conductive material;
   forming a second electrically conductive material over the undoped intrinsic semiconductor layer, where the first electrically conductive material, the undoped intrinsic semiconductor layer, and the second electrically conductive material define a p-i-n junction;
   depositing a second electrode between a set of spacers and in direct contact with the p-i-n-junction;
   depositing a phase change material over t p-i-n junction and in direct contact with the second electrode; and
   forming a third electrode over a portion of the phase change material.

9. The method of claim 8, wherein the first electrically conductive material is an n-type poly-silicon layer.

10. The method of claim 9, wherein second electrically conductive material is a p-type poly-silicon layer.

11. The method of claim 8, further comprising forming the p-i-n junction and the second electrode between interlayer dielectric (ILD) regions.

12. The method of claim 8, wherein the phase change material extends a length of the first electrode and a length of the first electrically conductive material.

13. The method of claim 8, wherein the electronic component is a poly-silicon diode.

14. The method of claim 8, wherein the p-i-n junction is an access device and the phase change material is a memory element, the access device combined with the memory element to be positioned between a plurality of first and third electrodes defining a crosspoint array.

15. A semiconductor structure for integrating an electronic component in back end of the line (BEOL) processing, the structure comprising:
   a first electrode disposed over a semiconductor substrate;
   a first electrically conductive material disposed over a portion of the first electrode;
   a second electrically conductive material disposed over the first electrically conductive material, where the first and second electrically conductive materials define a p-n junction;
   a second electrode located between a set of spacers and in direct contact with the p-n-junction;
   a phase change material located over the p-n junction and in direct contact with the second electrode; and
   a third electrode disposed over a portion of the phase change material.

16. The semiconductor structure of claim 15, wherein the first electrically conductive material is an n-type poly-silicon layer.

17. The semiconductor structure of claim 16, wherein second electrically conductive material is a p-type poly-silicon layer.

18. The semiconductor structure of claim 15, wherein the p-n junction and the second electrode are disposed between interlayer dielectric (ILD) regions.

19. The semiconductor structure of claim 15, wherein phase change material extends a length of the first electrode.

20. The semiconductor structure of claim 15, wherein the electronic component is a poly-silicon diode.

* * * * *